(12) United States Patent
Yeh

(10) Patent No.: US 7,622,980 B2
(45) Date of Patent: Nov. 24, 2009

(54) SWITCHED CAPACITOR CIRCUIT CAPABLE OF MINIMIZING CLOCK FEEDTHROUGH EFFECT AND HAVING LOW PHASE NOISE AND METHOD THEREOF

(75) Inventor: En-Hsiang Yeh, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 618 days.

(21) Appl. No.: 11/469,875

(22) Filed: Sep. 3, 2006

(65) Prior Publication Data

US 2006/0290406 A1 Dec. 28, 2006

Related U.S. Application Data

(60) Division of application No. 10/710,472, filed on Jul. 14, 2004, now Pat. No. 7,332,951, which is a continuation-in-part of application No. 10/605,428, filed on Sep. 30, 2003, now Pat. No. 6,975,156.

(51) Int. Cl.
*G06F 7/64* (2006.01)
(52) U.S. Cl. ..................... 327/337; 331/36 C
(58) Field of Classification Search ................. 327/337; 331/36 C See application file for complete search history.

(56) References Cited

U.S. PATENT DOCUMENTS

| 5,977,840 | A | 11/1999 | Connell et al. |
| 6,181,215 | B1 | 1/2001 | Kuttner |
| 6,393,070 | B1 | 5/2002 | Reber |
| 6,975,156 | B2 | 12/2005 | Yeh |

FOREIGN PATENT DOCUMENTS

CN 1269920 A 10/2000

*Primary Examiner*—Evan Pert
(74) *Attorney, Agent, or Firm*—Winston Hsu

(57) ABSTRACT

A switched capacitor circuit includes a positive side capacitor coupled to a first positive side node; a first positive side switch element for selectively coupling the first positive side node to a second node according to a first control signal; and a precharge circuit coupled to the first positive side node for precharging the first positive side node to a precharge voltage for a predetermined time when the first positive side switch element is switched off according to the first control signal, and then for charging the first positive side node to a charge voltage until the first positive side switch element is switched on according to the first control signal. By rapidly precharging the first positive side node, the clock feedthrough effect is eliminated and the locking period of the VCO is shortened. Afterwards by charging the first positive side node, the phase noise of the VCO is minimized.

13 Claims, 14 Drawing Sheets

SWITCHED CAPACITOR CIRCUIT CAPABLE OF MINIMIZING CLOCK FEEDTHROUGH EFFECT AND HAVING LOW PHASE NOISE AND METHOD THEREOF

CROSS REFERENCE TO RELATED APPLICATIONS

This is a division of application Ser. No. 10/710,472 filed Jul. 14, 2004, from which the specification and drawings are carried forward without amendment and which is included herein by reference. Application Ser. No. 10/710,472 is itself a continuation-in-part of U.S. application Ser. No. 10/605,428, which was filed on 30 Sep. 2003 and is also included herein by reference.

BACKGROUND OF THE INVENTION

1. Field of the Invention

The present invention relates to switched capacitor circuits, and more particularly, to a switched capacitor circuit having low phase noise used in a voltage controlled oscillator (VCO) for minimizing the clock feedthrough effect and thereby preventing a VCO frequency drift phenomenon during the calibration and the synthesizer phase locking periods.

2. Description of the Prior Art

A voltage controlled oscillator (VCO) is commonly used for frequency synthesis in wireless communication circuits. As indicated by Welland, et al. in U.S. Pat. No. 6,226,506, a wireless communication system typically requires frequency synthesis in both its receiving and transmitting path circuitries.

FIG. 1 shows a prior art VCO circuit. An LC type VCO used in a frequency synthesizer contains a resonator 10 with a basic resonant structure including an inductor 12 connected between a first oscillator node OSC_P and a second oscillator node OSC_N. Connected in parallel with the inductor 12 is a continuously variable capacitor 14 and a plurality of discretely variable capacitors 16. The continuously variable capacitor 14 is used for fine-tuning a desired capacitance while the plurality of discretely variable capacitors 16 is used for coarse tuning. The resistive loss of the parallel combination of the inductor 12 and the capacitors 14, 16 is compensated by a negative resistance generator 18 for sustaining the oscillation.

Each discretely variable capacitor in the plurality of discretely variable capacitors 16 is made up of a switched capacitor circuit 20 and each switched capacitor circuit is controlled by an independent control signal (SW_1 to SW_N). Based on the control signal SW_N, the switched capacitor circuit 20 selectively connects or disconnects a capacitor 24 to the resonator 10 of the VCO. Different on/off combinations of the switched capacitor circuits 20 result in a wider capacitance range of the LC type resonator 10 and hence providing a wider VCO oscillation frequency coverage.

FIG. 2 shows a switched capacitor circuit 20a according to the prior art. A capacitor 30 is connected between the first oscillator node OSC_P and a node A. A switch element 32 selectively connects node A to ground, and the switch element 32 is controlled by a control signal SW. When the switch element 32 is turned on, the capacitance associated with the capacitor 30 is added to the overall capacitance in the VCO resonator 10. When the switch element 32 is turned off, the capacitance looking into the first oscillator node OSC_P is the serially combined capacitor 30 and the off state capacitance associated with the switch element 32.

FIG. 3 shows a differential type switched capacitor circuit 20b according to the prior art. The differential type switched capacitor circuit has a much greater common-mode noise rejection ratio and is thus widely used in high-speed integrated circuit environments. In the differential switched capacitor circuit 20b, a positive side capacitor 40 is connected between the first oscillator node OSC_P and a node A. A positive side switch element 42 selectively connects node A to ground. A negative side capacitor 44 is connected between the second oscillator node OSC_N and a node B. A negative side switch element 46 selectively connects node B to ground. The two switch elements 42, 46 are controlled by the same control signal SW. When the switch elements 42, 46 are turned on, the capacitance associated with the serially combined positive and negative side capacitors 40, 44 is added to the overall capacitance in the VCO resonator 10. When the switch elements 42, 46 are turned off, the differential input capacitance is the serial combination of the positive and negative side capacitors 40, 44 and the parasitic capacitances of the switch elements 42 and 46. The overall input capacitance when both switch elements 42, 46 are turned off is much lower than that when both switch elements 42, 46 are turned on.

FIG. 4 shows a second differential type switched capacitor circuit 20c according to the prior art. The second differential switched capacitor circuit 20c includes the same components as shown in the first differential switched capacitor circuit 20b except an additional center switch element 48 is used to lower the overall turn-on switch resistance connected between the nodes A and B. All three switch elements 42, 46, 48 are controlled by the same control signal SW. When the switch elements 42, 46, 48 are turned on, the capacitance associated with the serially combined positive and negative side capacitors 40, 44 is added to the overall capacitance in the VCO resonator 10. When the switch elements 42, 46, 48 are turned off, the differential input capacitance is the serially combined positive and negative side capacitors 40, 44 and the parasitic capacitances of the switch elements 42, 46 and 48. The overall input capacitance when all switch elements 42, 46, 48 are turned off is much lower than that when all switch elements 42, 46, 48 are turned on.

Regardless of whether the single ended implementation shown in FIG. 2 or one of the differential implementations shown in FIG. 3 and FIG. 4 is used, when the switched capacitor circuit 20a, 20b, 20c is turned off, a momentary voltage step change occurs at node A (and, in the case of the differential implementations, also at node B). The momentary voltage step causes an undesired change in the overall capacitance, and ultimately, an undesired change in the VCO frequency. Because NMOS switches are used in the examples shown in FIG. 2, FIG. 3, and FIG. 4, the momentary voltage step change is a voltage drop when the switch elements 32, 42, 46, 48 are turned off. In other p-type transistor based implementations, the momentary voltage step could also be a voltage spike.

Using the single ended case shown in FIG. 2 as an example, when the switch element 32 is turned off, charge carriers are injected into the junction capacitance connected between the source and drain terminals of the switch element 32. The injection produces an undesired voltage step change across the capacitive impedance and appears as a voltage drop at node A. This effect is known as the clock feedthrough effect and appears as a feedthrough of the control signal SW from the gate terminal of the switch element 32 to the source and drain terminals of the switch element 32. When the switch element 32 is turned on, node A is connected to ground so the feedthrough of the control signal SW is of no consequence. However, when the switch element 32 is turned off, the feedthrough of the control signal SW causes a voltage step, in the form a voltage drop in the implementation shown in FIG. 2, to appear at node A. Because of the dropped voltage at node A, the diode formed by the N⁺ diffusion of the switch element 32 and the P type substrate in the off state will be slightly forward biased. The voltage level at node A will spike low and then recover to ground potential as the slightly forward biased junction diode formed by the switch element 32 in the off state allows subthreshold and leakage currents to flow. The voltage drop and recovery at node A changes the loaded capacitance of the VCO resonator 10 and causes an undesired momentarily drift in the VCO frequency.

Similarly, when the differential switched capacitor circuit 20c shown in FIG. 4 switches off, it suffers from the same clock feedthrough effect problem at node A and at node B. The positive side node A has an undesired voltage step change caused by the clock feedthrough effect of both the positive side switch element 42 and the center switch element 48. Similarly, the negative side node B has an undesired voltage step change caused by the clock feedthrough effect of both the negative side switch element 46 and the center switch element 48. The voltage step change and recovery at node A and node B changes the loaded capacitance of the VCO resonator 10 and causes an undesired momentary drift in the VCO frequency.

SUMMARY OF THE INVENTION

One objective of the claimed invention is therefore to provide a switched capacitor circuit and method of controlling a switched capacitor circuit capable of minimizing the clock feedthrough effect and having low phase noise, to solve the above-mentioned problems.

According to an exemplary embodiment of the claimed invention, a switched capacitor circuit is disclosed comprising a positive side capacitor coupled to a first positive side node; a first positive side switch element for selectively coupling the first positive side node to a second node according to a first control signal; and a precharge circuit coupled to the first positive side node for precharging the first node to a precharge voltage for a predetermined time when the first positive side switch element is switched off according to the first control signal, and then for charging the first positive side node to a charge voltage until the first positive side switch element is switched on according to the first control signal.

According to another exemplary embodiment of the claimed invention, a method is disclosed for controlling a switched capacitor circuit having a capacitor coupled to a first positive side node. The method comprises the following steps: disconnecting the first positive side node from a second node to switch off the switched capacitor circuit according to a first control signal; precharging the first positive side node to a precharge voltage for a predetermined time when the switched capacitor circuit is switched off according to the first control signal; and then charging the first positive side node to a charge voltage until the switched capacitor circuit is switched on according to the first control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
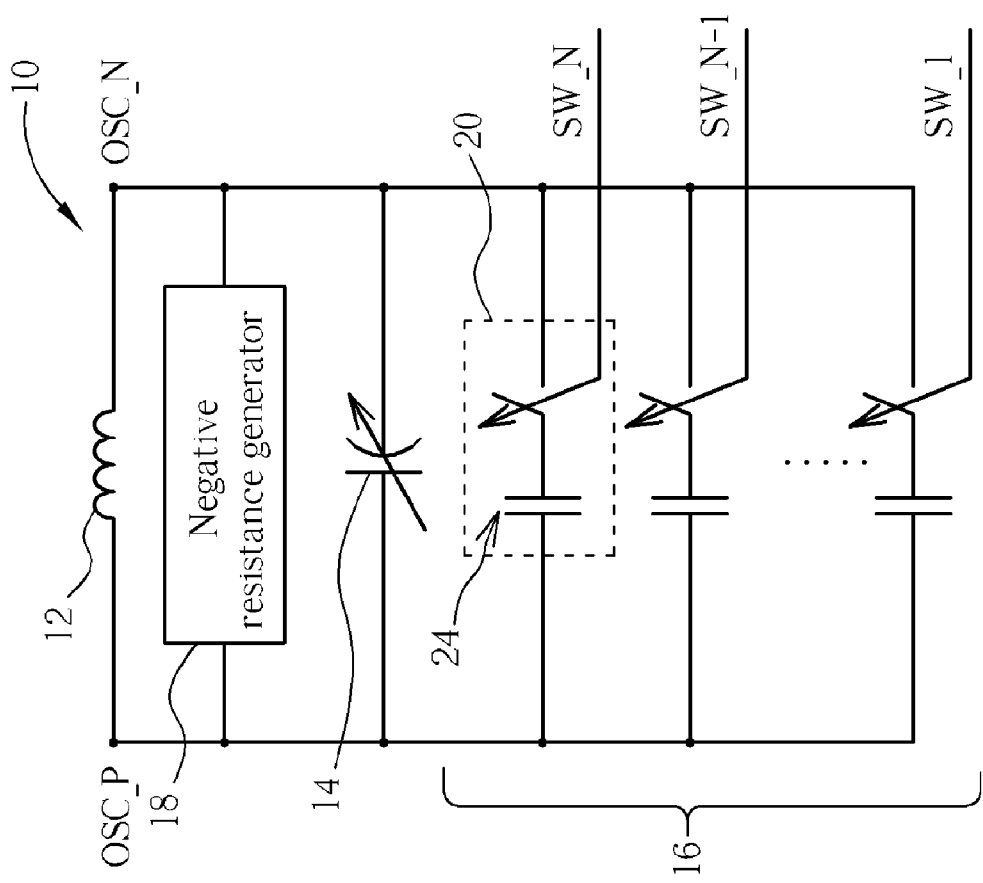
FIG. 1 is a schematic diagram of a prior art Voltage Controlled Oscillator (VCO) circuit used in a frequency synthesizer.
Figure 2:
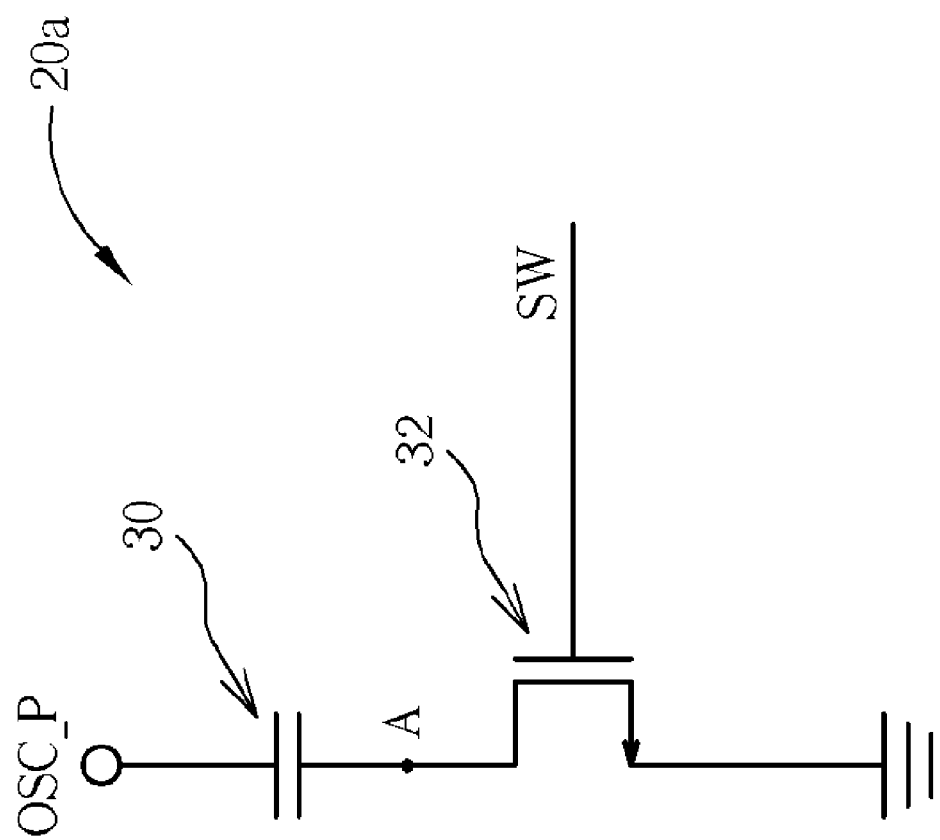
FIG. 2 is a switched capacitor circuit used in the VCO of FIG. 1 according to the prior art.
Figure 3:
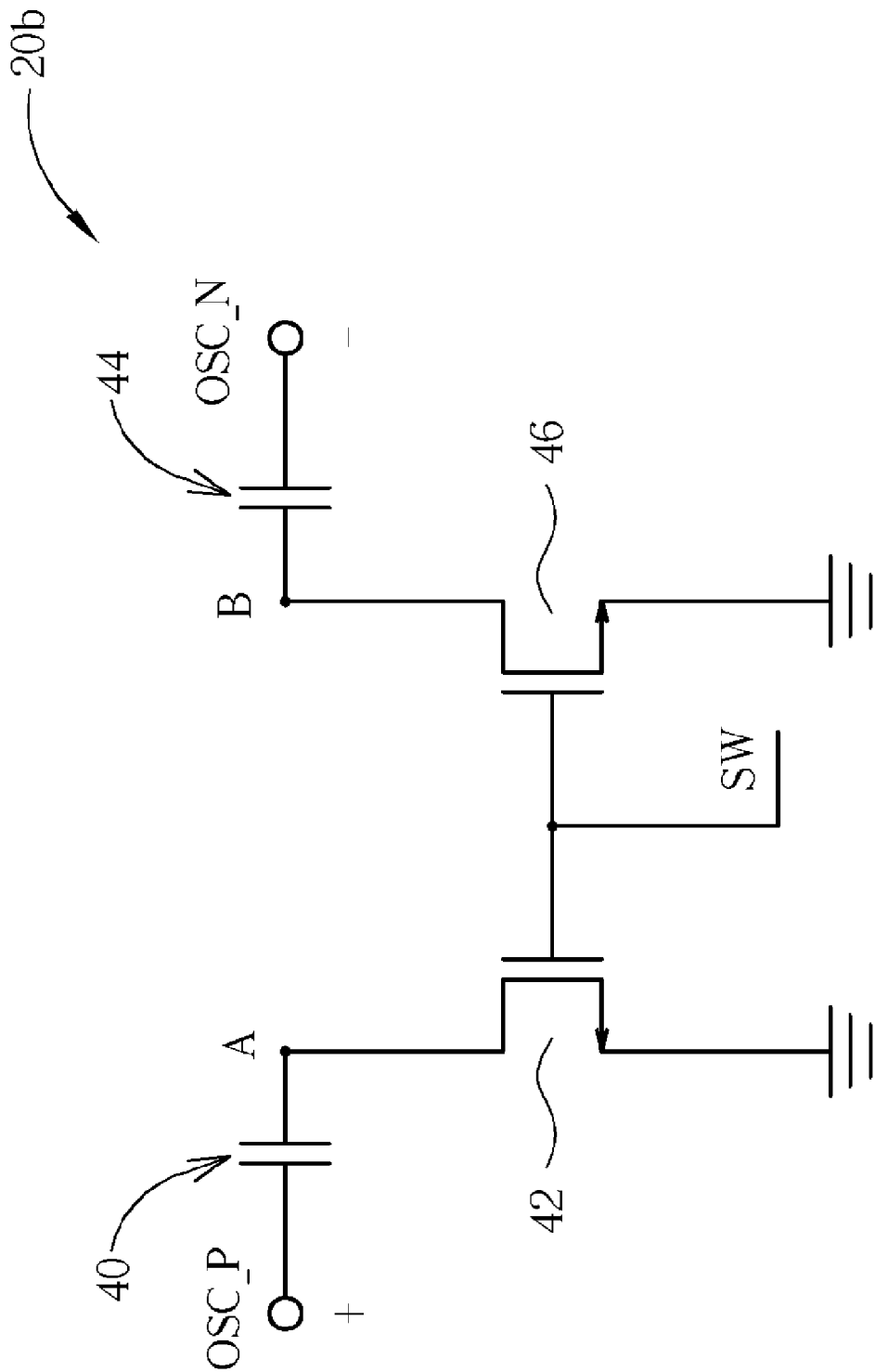
FIG. 3 is a differential type switched capacitor circuit used in the VCO of FIG. 1 according to the prior art.
Figure 4:
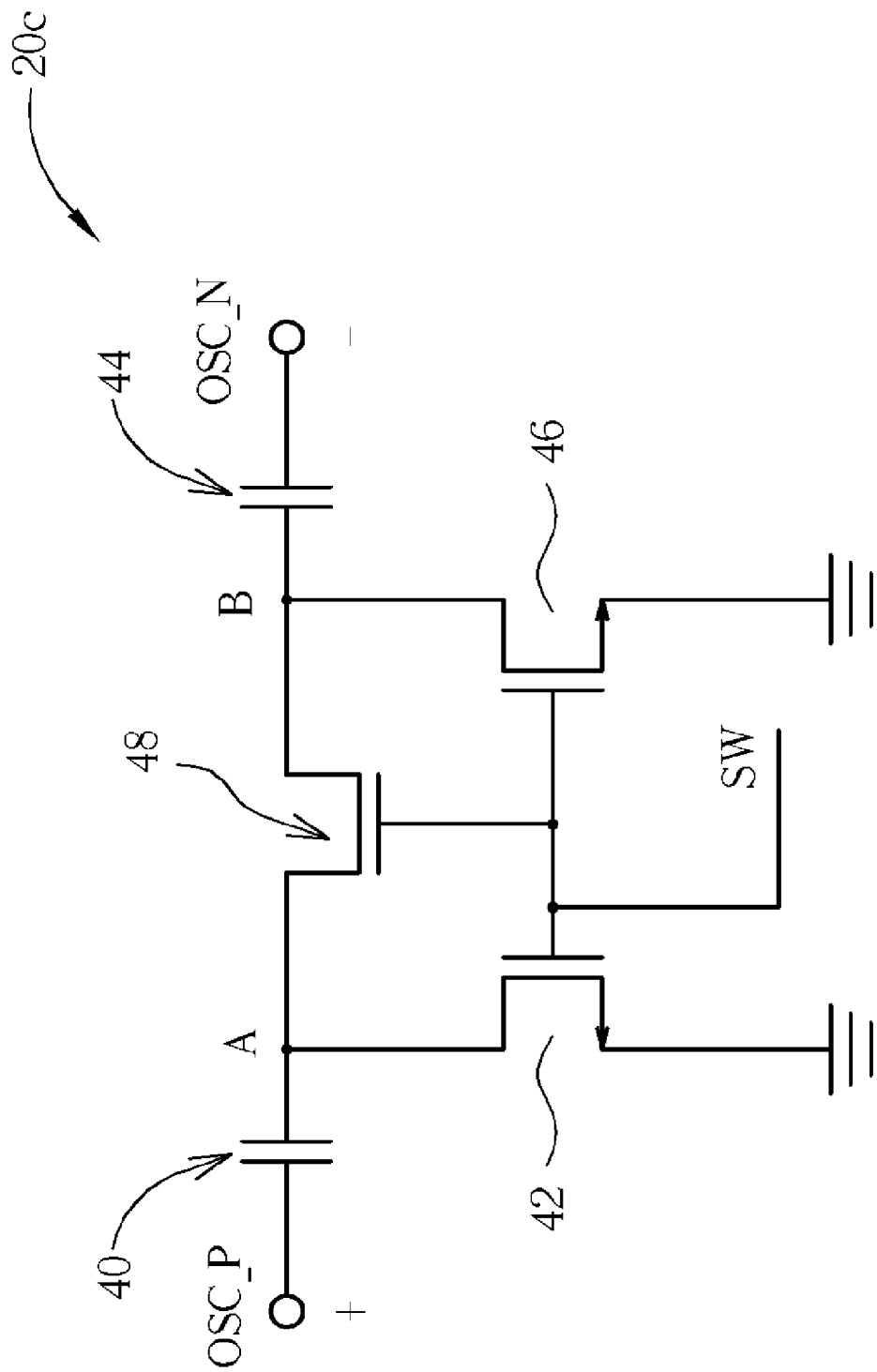
FIG. 4 is the differential type switched capacitor circuit of FIG. 3 with the addition of a center switch element.
Figure 5:
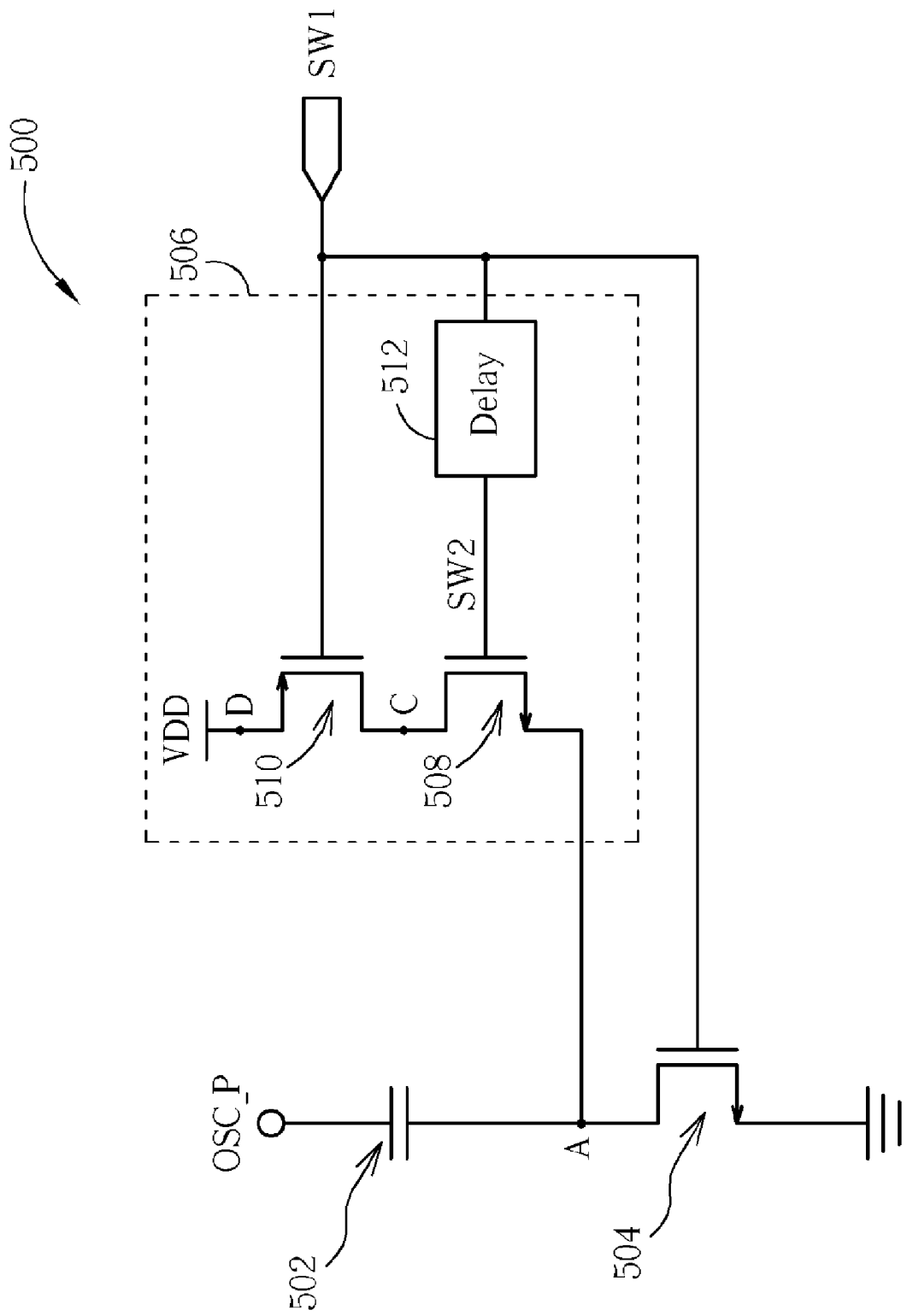
FIG. 5 shows a switched capacitor circuit according to a first embodiment of the present invention.

FIG. 5 shows a switched capacitor circuit 500 according to a first embodiment of the present invention. In FIG. 5, the switched capacitor circuit 500 includes a capacitor 502, a first switch element 504, and a precharge circuit 506. The precharge circuit 506 includes a second switch element 508, a precharge switch element 510, and a delay unit 512. The capacitor 502 is connected between the first oscillator node OSC_P and a node A. The first switch element 504 selectively connects node A to a second node, which is ground in this embodiment, according to a first control signal SW1. The precharge switch element 510 is coupled to a node D being a constant supply voltage of VDD in this embodiment. When the switched capacitor circuit 500 is turned off according to the first control signal SW1, the first switch element 504 disconnects node A from the ground. The precharge circuit 506 is coupled to node A for precharging node A to a precharge voltage for a predetermined period of time when the switched capacitor circuit 500 is switched off according to the first control signal SW1. After the predetermined period of time, the precharge circuit 506 then charges node A to a charge voltage until the switched capacitor circuit 500 is switched on again according to the first control signal SW1.

Figure 6:
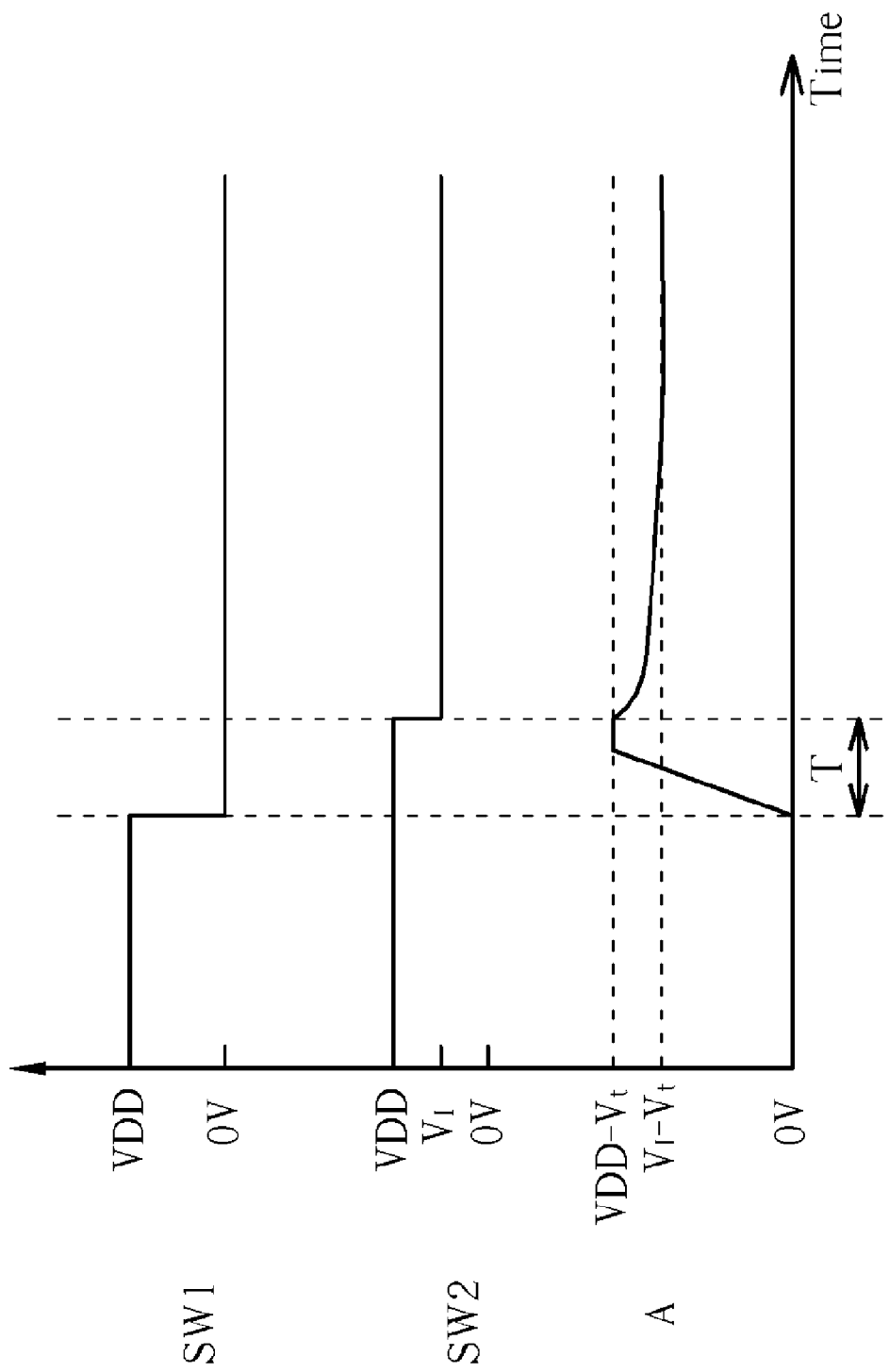
FIG. 6 shows a waveform diagram of the first control signal, a second control signal outputted by the delay unit, and the resulting voltage level at node A of the switched capacitor circuit shown in FIG. 5.

FIG. 6 shows a waveform diagram of the first control signal SW1, a second control signal SW2 outputted by the delay unit 512, and the resulting voltage level at node A of the switched capacitor circuit 500 according to the first embodiment. In this embodiment, when the switched capacitor circuit 500 is switched off, the first control signal SW1 drops from a logic high value (VDD) to a logic low value (0V). The precharge switch element 510 in the precharge circuit 506 is thereby turned on at the same time that the first switch element 504 is turned off according to the first control signal SW1. The second switch element 508 continues to be turned on by the second control signal SW2, which is formed in the delay unit 512 by delaying the first control signal SW1 by a predetermined time period T and converting the logic low value of the first control signal SW1 to a value higher than 0V when its input signal is at logic low value of 0V. In this way, the second switch element 508 acts as a forward biased diode and node A is rapidly charged to a precharge voltage being the supply voltage VDD minus a voltage drop $V_t$ across the second switch element 508 caused by the gate-source voltage of the second switch element 508. This rapid precharging of node A to VDD-$V_t$ prevents the momentary voltage step at node A caused by the clock feedthrough effect. Note that, in general, the logic high value of the second control signal SW2 can be larger than the voltage drop $V_t$ while smaller than the supply voltage VDD. The logic low value of the second control signal SW2 can be larger than 0V while smaller than the logic high value. Preferably, the logic low value of the second control signal SW2 is closer to the logic high value of the second control signal SW2 rather than to 0V. In result, a first voltage difference between values of the first control signal SW1 in an on-state and an off-state is greater than a second voltage difference between a logic high voltage level and a logic low voltage level of the second control signal SW2.

After the predetermined time period T, the second control signal SW2 drops to a logic low value being an intermediate voltage value $V_I$, which is a positive value. Because the voltage level at node A (VDD-$V_t$) is higher than the intermediate voltage $V_I$, the second switch element 508 is turned off. Gradually, charge leaks through the first switch element 504 until the voltage at node A drops below a charge voltage of $V_I$-$V_t$. When this occurs, the second switch element 504 turns on and charges node A to $V_I$-$V_t$. In this way, after the predetermined time period T and until the switched capacitor circuit 500 is turned on again by the first control signal SW1, the precharge circuit 506 controls the voltage on node A to be equal to the charge voltage of $V_I$-$V_t$. This is beneficial because a parasitic capacitance associated with the parasitic diode formed by the first switch element 504 in the off state is minimized by the constant charge voltage $V_I$-$V_t$ formed across the first switch element 504 by the precharge circuit 506, and a phase noise of the VCO circuit is thereby reduced.

Figure 7:
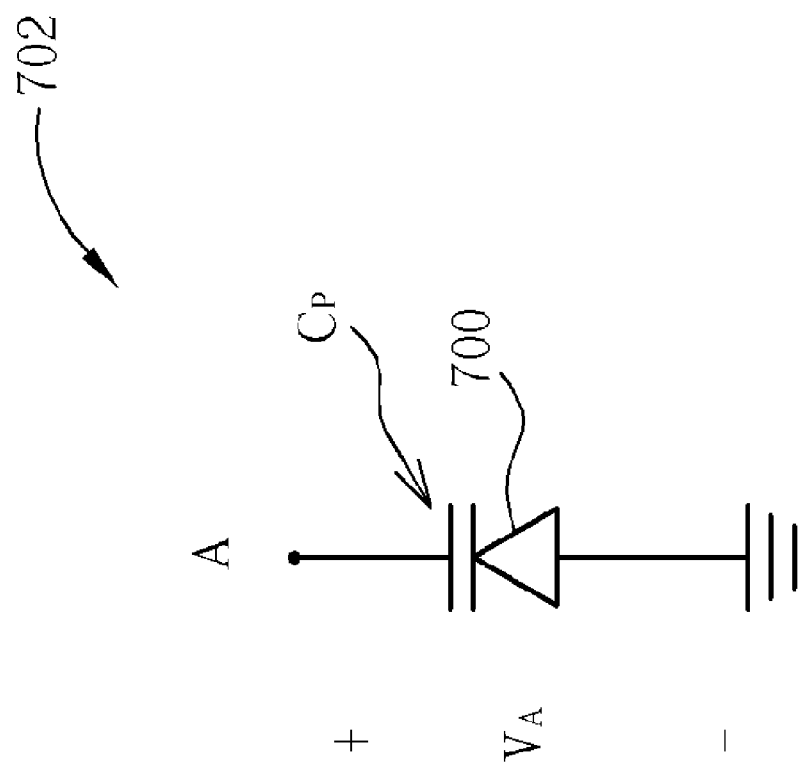
FIG. 7 shows a parasitic diode formed by the first switch element in the off state in FIG. 5.

FIG. 7 shows a parasitic diode 700 formed by the first switch element 504 in the off state in FIG. 5. The parasitic diode 700 acts as a varactor 702 connected between node A and the second node being ground in the first embodiment of the present invention. The varactor 702 has a parasitic capacitance of $C_p$ determined by the voltage $V_A$ at node A in FIG. 5.

Figure 8:
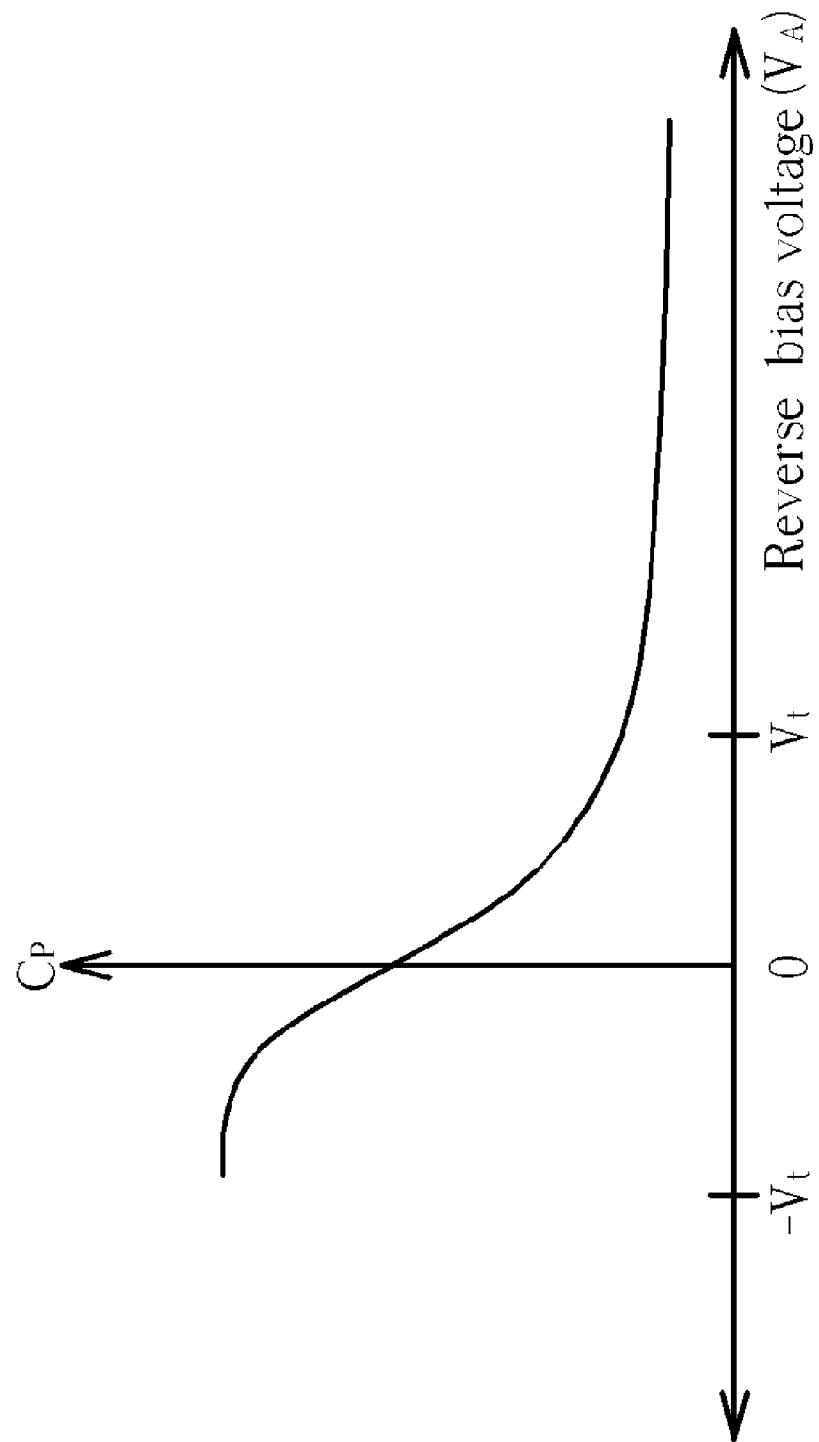
FIG. 8 shows a capacitance vs. reverse bias voltage diagram of the varactor shown in FIG. 7.

FIG. 8 shows a capacitance vs. reverse bias voltage diagram of the varactor 702 shown in FIG. 7. As the reverse bias voltage ($V_A$) across the varactor 702 changes, the associated parasitic capacitance $C_p$ changes. However, this change is not linear. As shown in FIG. 8, reverse bias voltages higher than $V_t$ have a smooth varying parasitic capacitance $C_p$. The present invention uses this fact to charge node A to a voltage much larger than the threshold voltage $V_t$ of the first switch element 504. This means that if some charge on node A should leak to ground through the first switch element 504, the parasitic capacitance $C_p$ will change slowly. In this way, it is much easier for the VCO to perform locking when the parasitic capacitance $C_p$ is varying due to the leakage currents. Therefore the locking period of the VCO is shortened so the present invention allows the frequency synthesizer to reach a stable state faster than the prior art implementations, and the voltage $V_A$ at node A and the capacitance value associated with the switched capacitor circuit 500 in the off-state are stabilized and do not change due to leakage currents through the first switch element 500.

Figure 9:
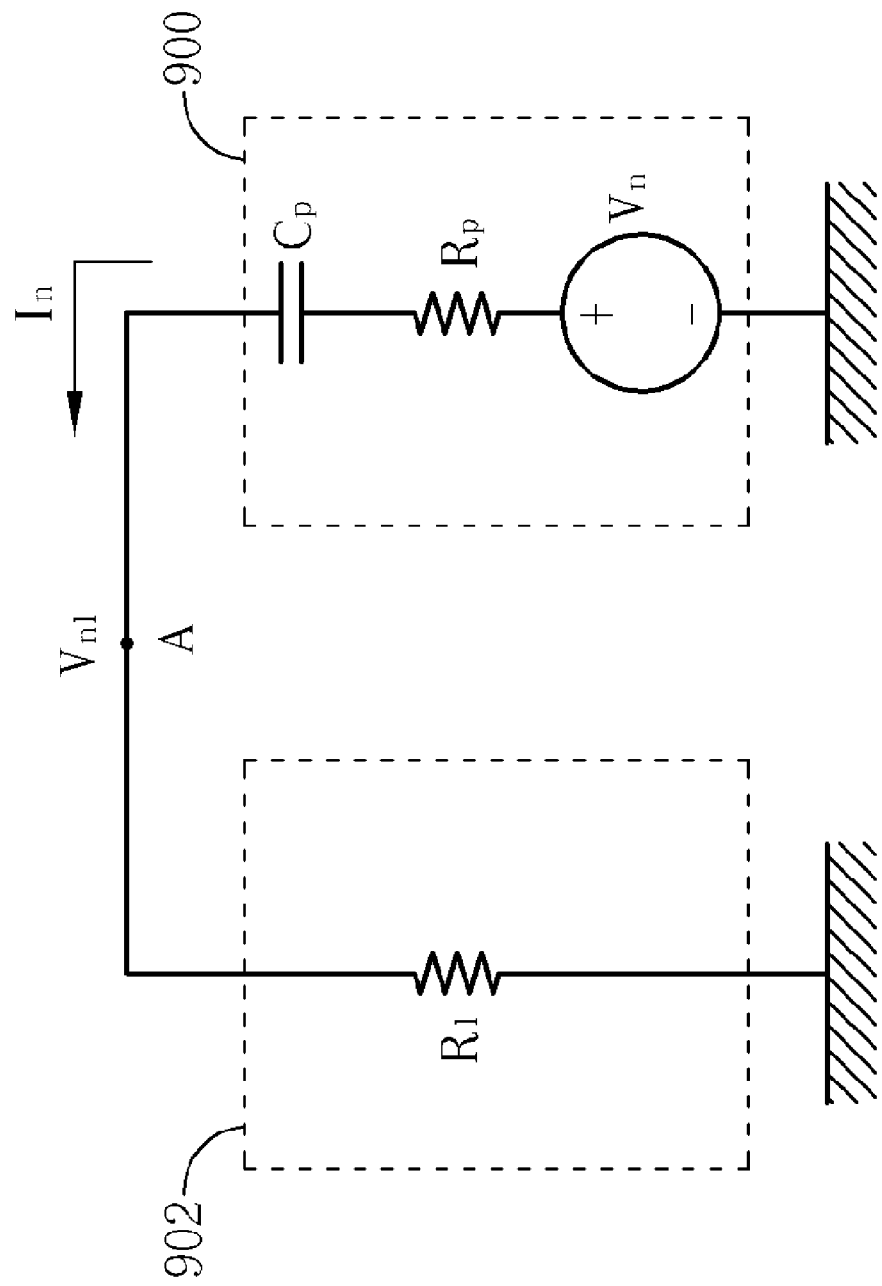
FIG. 9 shows an equivalent switch element and an equivalent VCO.

FIG. 9 shows an equivalent switch element 900 and an equivalent VCO 902. The equivalent switch element 900 formed by the first switch element 504 of FIG. 5 in the off state includes a parasitic resistance $R_p$, the parasitic capacitance $C_p$, and a noise source $V_n$, which comes from substrate noise and thermal noise. The equivalent VCO 902 includes a resistor $R_1$, the value of which is equal to the equivalent impedance of the VCO circuit. The current $I_n$ flowing through node A is determined from the following formula:

$$I_n = \frac{V_{n1}}{R_1} = \frac{V_n}{R_1 + R_p + \frac{1}{2\pi f \cdot C_p}} \quad \text{(formula 1)}$$

where f is the frequency of the VCO oscillation and $V_{n1}$ is the overall noise, which contributes to the phase noise of the VCO circuit seen at node A.

By solving formula 1 for the overall phase noise $V_{n1}$, the following formula is obtained:

$$V_{n1} = \frac{V_n \cdot R_1}{\left(R_1 + R_p + \frac{1}{2\pi f \cdot C_p}\right)} \quad \text{(formula 2)}$$

At a constant frequency value such as 1 GHz, it can be seen from the above formulas that by minimizing the parasitic capacitance $C_p$ of the equivalent switch element 900, the overall noise $V_{n1}$ is minimized. Therefore, it desirable to have a low parasitic capacitance $C_p$. Because of this, the present invention provides a constant reverse bias voltage $V_A$ across the varactor 702, which produces a smaller $C_p$ value and reduces the phase noise. By coupling node A to the charge voltage, the voltage $V_A$ at node A approaches a constant charge voltage potential of $V_I$-$V_{508}$, where $V_{508}$ is a voltage drop $V_t$ across the second switch element 508 sufficient to turn on the second switch element 508. Therefore, the charge voltage is equal to $V_I$-$V_t$. In this way, a larger reverse bias voltage is present across the varactor 702 which minimizes the parasitic capacitance $C_p$. Therefore the phase noise associated with the switched capacitor circuit 500 according to the present invention is lower than that of the prior art implementations. By ensuring the charge voltage is greater than a predetermined threshold, the present invention can reduce the noise $V_{n1}$ on node A and hence the phase noise of the VCO is reduced to a desired level.

Figure 10:
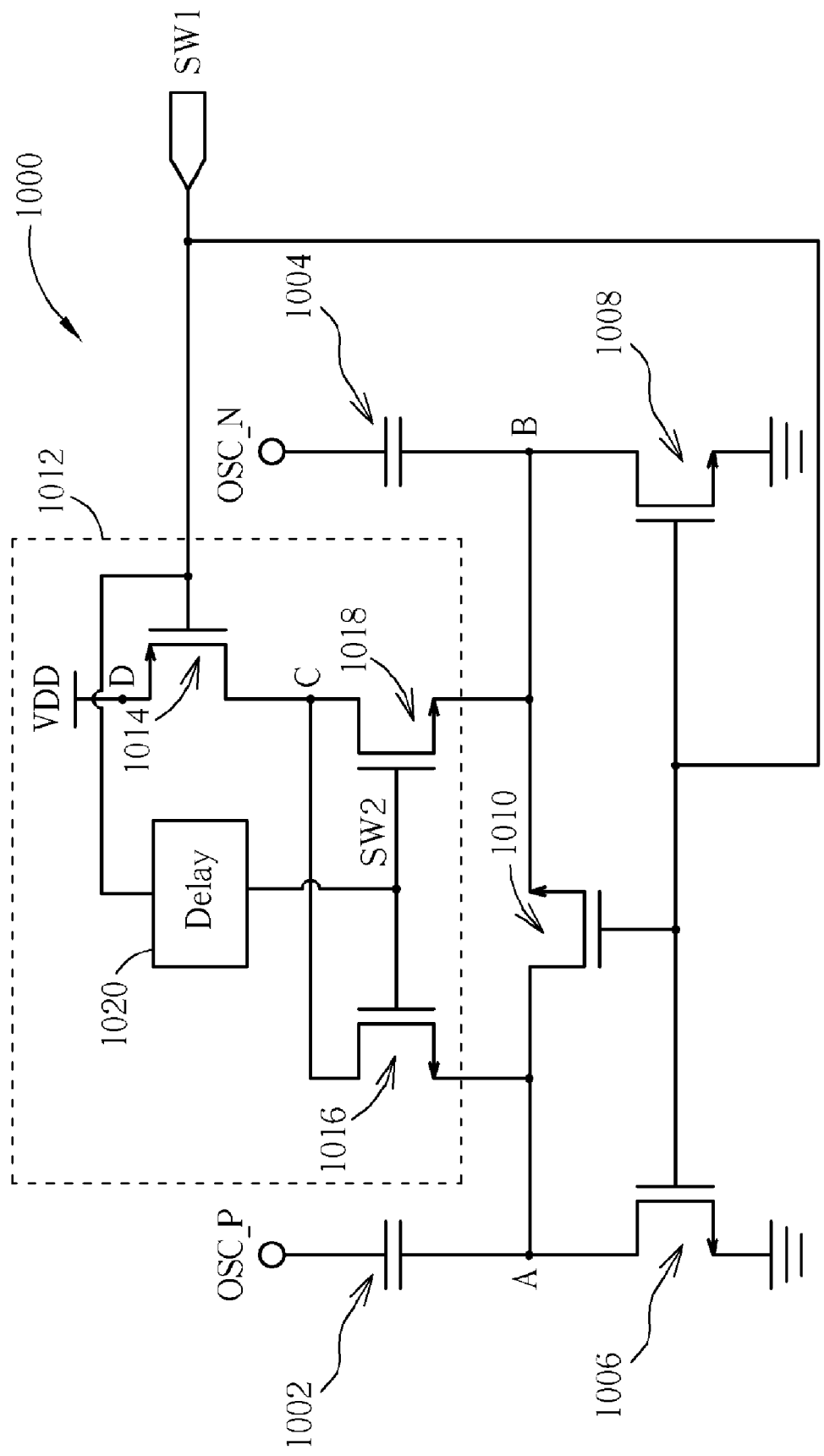
FIG. 10 is a differential switched capacitor circuit according to a second embodiment of the present invention.

FIG. 10 is a differential switched capacitor circuit 1000 according to a second embodiment of the present invention. The differential switched capacitor circuit 1000 comprises a positive side capacitor 1002, a negative side capacitor 1004, a first positive side switch element 1006, a first negative side switch element 1008, a center switch element 1010, and a precharge circuit 1012. In the second embodiment of the present invention, the precharge circuit 1012 includes a second positive side switch element 1016, a second negative side switch element 1018, a precharge switch element 1014, and a delay unit 1020.

Operationally similar to the single ended version shown in FIG. 5, in FIG. 10 the positive side capacitor 1002 is connected between the first oscillator node OSC_P and a node A. Additionally, the negative side capacitor 1004 is connected between the second oscillator node OSC_N and a node B. The first positive side switch element 1006 selectively connects node A to a second node (being ground in this embodiment) according to the first control signal SW1, while the first negative side switch element 1008 selectively connects node B to the second node (ground) according to the first control signal SW1. The precharge switch element 1014 is coupled to a node D being a constant supply voltage of VDD in this embodiment. In the preferred differential embodiments of the present invention, the center switch element 1010 selectively connects node A to node B according to the first control signal SW1, however, other differential embodiments not including the center switch 1010 are also fully supported by the present invention. When the switched capacitor circuit 1000 is turned off according to the first control signal SW1, the first positive side switch element 1006 disconnects node A from ground and the first negative side switch element 1008 disconnects node B from ground. Additionally, the precharge circuit 1012 is coupled to node A and node B for precharging node A and node B to the precharge voltage for the predetermined period of time when the switched capacitor circuit 1000 is switched off according to the first control signal SW1. After the predetermined period of time, the precharge circuit 1012 then charges node A and node B to the charge voltage until the switched capacitor circuit 1000 is switched on again according to the first control signal SW1.

Figure 11:
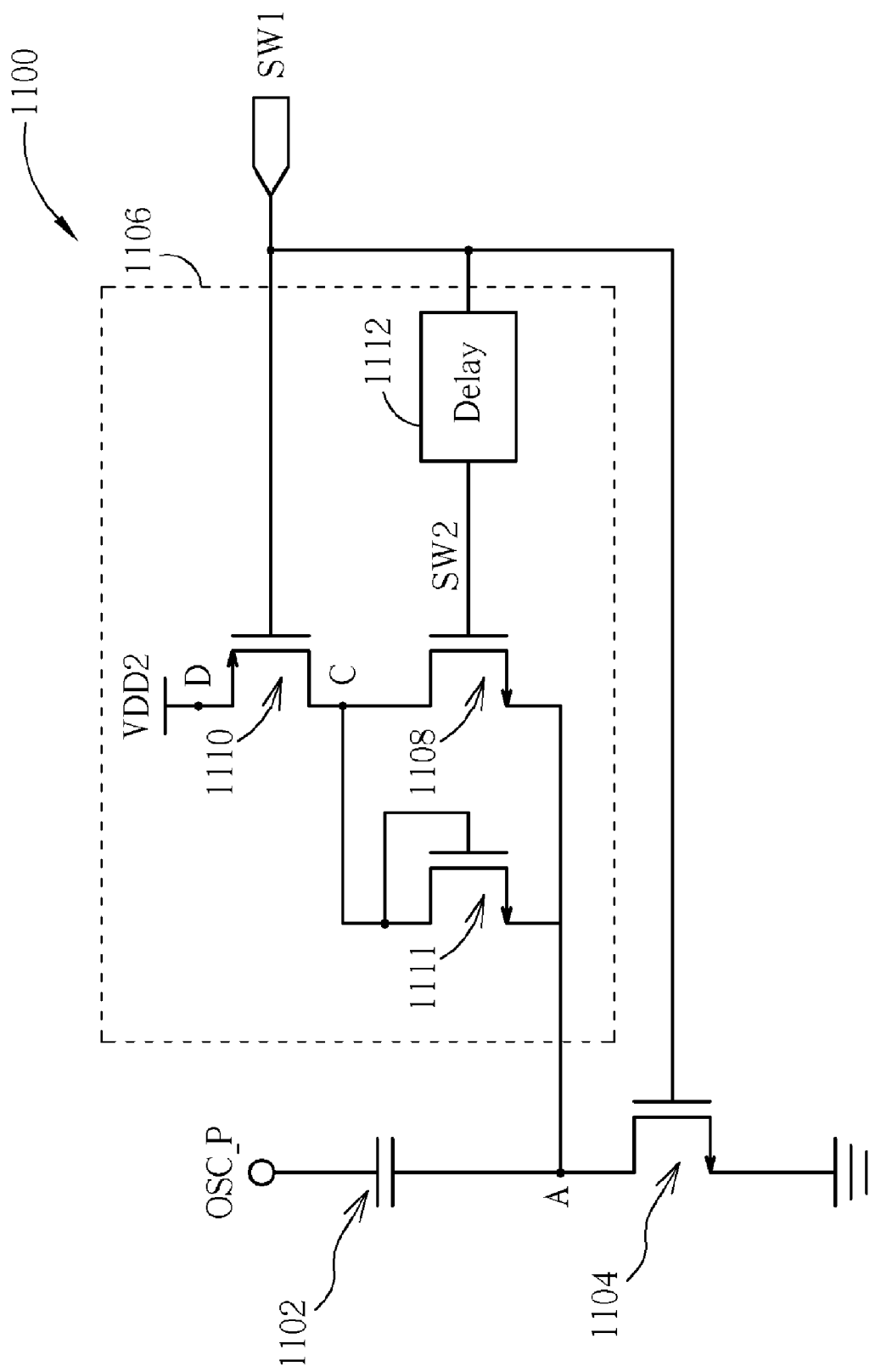
FIG. 11 shows a switched capacitor circuit according to a third embodiment of the present invention.

FIG. 11 shows a switched capacitor circuit 1100 according to a third embodiment of the present invention. In FIG. 11, the switched capacitor circuit 1100 includes a capacitor 1102, a first switch element 1104, and a precharge circuit 1106. The precharge circuit 1106 includes a second switch element 1108, a precharge switch element 1110, a diode 1111 (implemented using a transistor), and a delay unit 1112. The capacitor 1102 is connected between the first oscillator node OSC_P and a node A. The first switch element 1104 selectively connects node A to a second node, which is ground in this embodiment, according to a first control signal SW1. In the third embodiment, the precharge switch element 1110 is coupled to a node D being a constant voltage of VDD2, where VDD2 is a predetermined value smaller than VDD. When the switched capacitor circuit 1100 is turned off according to the first control signal SW1, the first switch element 1104 disconnects node A from the ground. The precharge circuit 1106 is coupled to node A for precharging node A to a precharge voltage for a predetermined period of time when the switched capacitor circuit 1100 is switched off according to the first control signal SW1. After the predetermined period of time, the precharge circuit 1106 then charges node A to a charge voltage until the switched capacitor circuit 1100 is switched on again according to the first control signal SW1.

Figure 12:
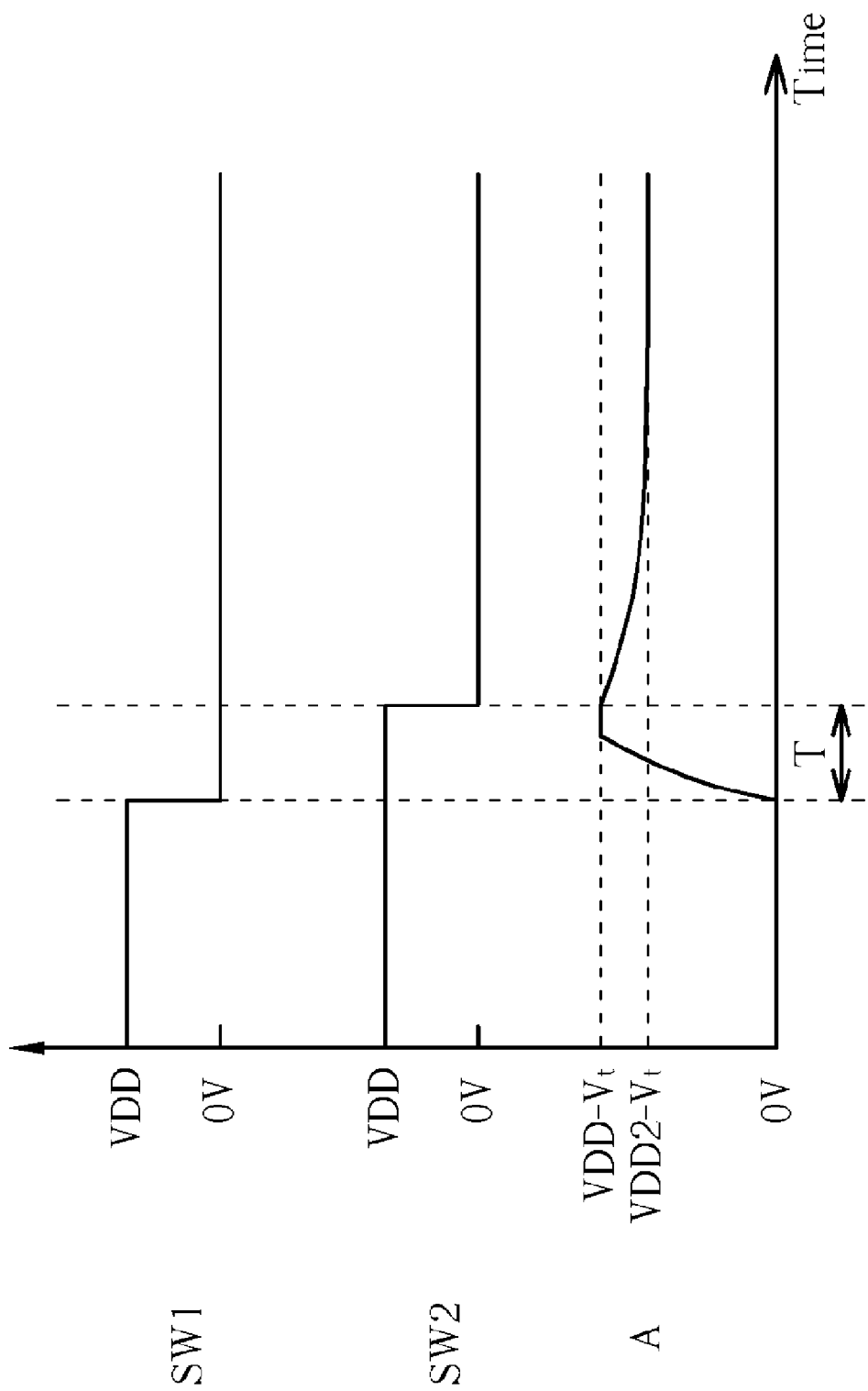
FIG. 12 shows a waveform diagram of the first control signal, a second control signal outputted by the delay unit, and the resulting voltage level at node A of the switched capacitor circuit shown in FIG. 11.

FIG. 12 shows a waveform diagram of the first control signal SW1, a second control signal SW2 outputted by the delay unit 1112, and the resulting voltage level at node A of the switched capacitor circuit 1100 according to the third embodiment. In this embodiment, when the switched capacitor circuit 1100 is switched off, the first control signal SW1 drops from a logic high value (VDD) to a logic low value (0V). The precharge switch element 1110 in the precharge circuit 1106 is thereby turned on at the same time that the first switch element 1104 is turned off according to the first control signal SW1. The second switch element 1108 continues to be turned on by the second control signal SW2, which is formed in the delay unit 1112 by delaying the first control signal SW1 by the predetermined time period T. In this way, the second switch element 1108 acts as a forward biased diode and node A is rapidly charged to a precharge voltage being VDD minus a voltage drop $V_t$ across the second switch element 1108 caused by the gate-source voltage of the second switch element 1108. This rapid precharging of node A to VDD-$V_t$ prevents the momentary voltage step at node A caused by the clock feedthrough effect.

After the predetermined time period T, the second control signal SW2 drops to a logic low value of 0V. Because the voltage level at node A (VDD-$V_t$) is higher than the second control signal SW2 (0V), the second switch element 1108 is turned off and the diode 1111 is reversed biased and therefore does not pass current. Gradually, charge leaks through the first switch element 1104 until the voltage at node A drops below a charge voltage of VDD2-$V_t$, where $V_t$ is the turn-on voltage drop across the diode 1111. When this occurs, the diode 1111 turns on and charges node A to VDD2-$V_t$. In this way, after the predetermined time period T and until the switched capacitor circuit 1100 is turned on again by the first control signal SW1, the precharge circuit 1106 controls the voltage on node A to be equal to the charge voltage of VDD2-$V_t$. Again, this is beneficial because the parasitic capacitance associated with the parasitic diode formed by the first switch element 1104 in the off-state is minimized by the constant charge voltage VDD2-$V_t$ formed across the first switch element 1104 by the precharge circuit 1106, and the phase noise of the VCO circuit is thereby reduced. Note that, in general, the logic high value of the second control signal SW2 can be larger than VDD2, while the logic low value of the second control signal SW2 can be a value larger than 0V and smaller than the voltage drop $V_t$. In result, a first voltage difference between the voltage at second node and the value of the second control signal SW2 in an off-state is smaller than a second voltage difference between the voltage at node D and the value of the second control signal SW2 in an on-state.

Figure 13:
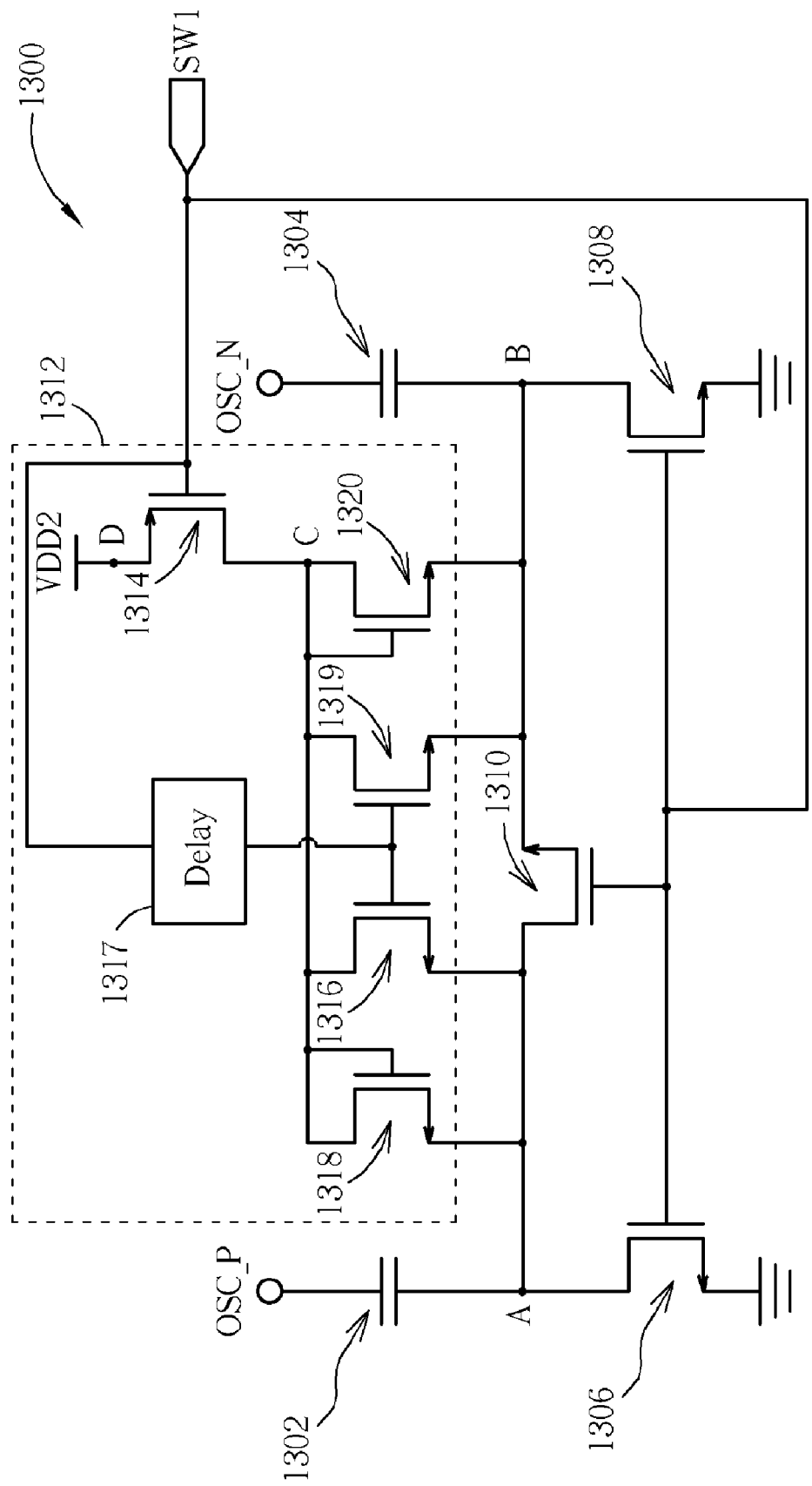
FIG. 13 is a differential switched capacitor circuit according to a fourth embodiment of the present invention.

FIG. 13 is a differential switched capacitor circuit 1300 according to a fourth embodiment of the present invention. The differential switched capacitor circuit 1300 comprises a positive side capacitor 1302, a negative side capacitor 1304, a first positive side switch element 1306, a first negative side switch element 1308, a center switch element 1310, and a precharge circuit 1312. In the fourth embodiment of the present invention, the precharge circuit 1312 includes a second positive side switch element 1316, a second negative side switch element 1319, a precharge switch element 1314, a delay unit 1317, a positive side diode 1318 (implemented using a transistor), and a negative side diode 1320 (implemented using a transistor).

Operationally similar to the single ended version shown in FIG. 11, in FIG. 13 the positive side capacitor 1302 is connected between the first oscillator node OSC_P and a node A, and the negative side capacitor 1304 is connected between the second oscillator node OSC_N and a node B. The first positive side switch element 1306 selectively connects node A to a second node (ground) according to the first control signal SW1, while the first negative side switch element 1308 selectively connects node B to the second node (ground) according to the first control signal SW1. The precharge switch element 1314 is coupled to a node D being a constant voltage of VDD2, where VDD2 is a predetermined value smaller than VDD. As previously stated, in the preferred differential embodiments of the present invention, the center switch element 1310 selectively connects node A to node B according to the first control signal SW1, however, other differential embodiments not including the center switch 1310 are also fully supported by the present invention. When the switched capacitor circuit 1300 is turned off according to the first control signal SW1, the first positive side switch element 1306 disconnects node A from ground and the first negative side switch element 1308 disconnects node B from ground. Additionally, the precharge circuit 1312 is coupled to node A and node B for precharging node A and node B to the precharge voltage for the predetermined period of time when the switched capacitor circuit 1300 is switched off according to the first control signal SW1. After the predetermined period of time, the precharge circuit 1312 then charges node A and node B to the charge voltage until the switched capacitor circuit 1300 is switched on again according to the first control signal SW1.

It should also be noted that although MOS transistors are used as the switch devices throughout the diagrams of the detailed description of the preferred embodiment, this is for example only and BJT transistors are also supported by the present invention. In FIG. 11 and FIG. 13, using BJTs, the diodes 1111, 1318, 1320 can be formed by shorting the base and collector of the BJT transistor together. Additionally, both positive and negative logic can be used with respect to the first and second control signals SW1, SW2. In embodiments wherein a logic low on the first control signal SW1 causes the switched capacitor circuit to shut off and disconnect the capacitor from the VCO (as is shown in the diagrams throughout the detailed description of the preferred embodiment), the first and second (positive and negative) switch elements 504, 508, 1006, 1008, 1016, 1018, 1104, 1108, 1306, 1308, 1316, 1319 are n-type transistors, the precharge switch elements 510, 1014, 1110, 1314 are p-type transistors, the second node is ground, and the node D is a constant supply voltage. In an alternate embodiment, wherein a logic high on the first control signal SW1 causes the switched capacitor circuit to shut off and disconnect the capacitor from the VCO, the first and second (positive and negative) switch elements 504, 508, 1006, 1008, 1016, 1018, 1104, 1108, 1306, 1308, 1316, 1319 are p-type transistors, the precharge switch elements 510, 1014, 1110, 1314 are n-type transistors, the second node is a constant supply voltage, and the node D is ground.

Figure 14:
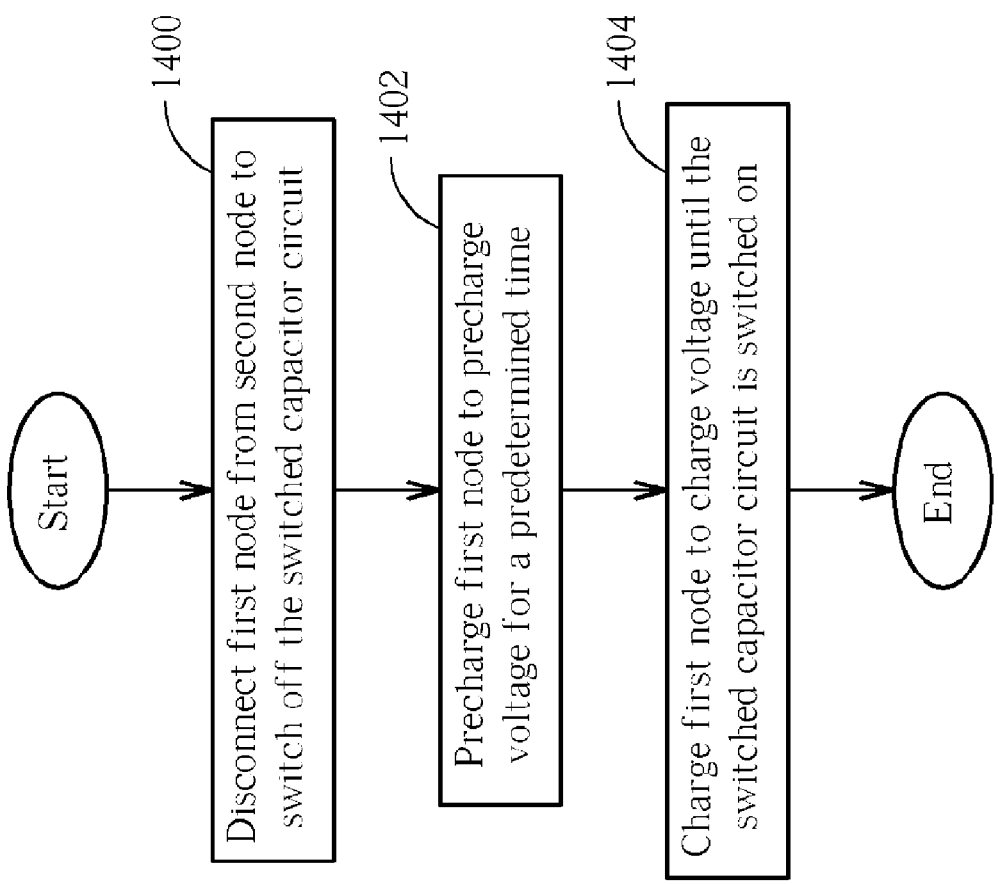
FIG. 14 is a flowchart describing a general method of controlling a switched capacitor circuit having a capacitor coupled to a first positive side node according to the present invention.

FIG. 14 is a flowchart describing a general method of controlling a switched capacitor circuit having a capacitor coupled to a first positive side node according to the present invention. The flowchart includes the following steps:

Step 1400: Disconnect the first positive side node from a second node to switch off the switched capacitor circuit according to a first control signal.

Step 1402: Precharge the first positive side node to a precharge voltage for a predetermined time when the switched capacitor circuit is switched off according to the first control signal.

Step 1404: Charge the first positive side node to a charge voltage until the switched capacitor circuit is switched on according to the first control signal.

In a first embodiment of the present invention method and using FIG. 5 as an example, steps 1402 and 1404 further involve coupling the first positive side node A to a third node C according to a second control signal SW2, coupling the third node C to the fourth node D according to the first control signal SW1, and generating the second control signal SW2 to be at a first voltage level for the predetermined time when the switched capacitor circuit is switched off according to the first control signal SW1, and then to be at a second voltage level for a remaining time while the switched capacitor circuit is switched off. By ensuring a first voltage difference between values of the first control signal SW1 in an on-state and an off-state (corresponding to the values that switch on and switch off the capacitor switched circuit, respectively) is greater than a second voltage difference between the first voltage level and the second voltage level, the clock feedthrough effect is eliminated, the locking period of the VCO is shortened, and the phase noise of the VCO is minimized.

In a second embodiment of the present invention method and using FIG. 11 as an example, steps 1402 and 1404 further involve coupling the first positive node A to a third node C according to the second control signal SW2, providing a diode coupled between the first positive side node A and the third node C, coupling the third node C to the fourth node D according to the first control signal SW1; and generating the second control signal SW2. Wherein, the second control signal SW2 is the first control signal SW1 delayed by the predetermined time, and the second node (ground) is coupled to a constant voltage source at a first voltage level, the fourth node D is coupled to a constant voltage source at a second voltage level. By ensuring a first voltage difference between the second voltage level and the value of the second control signal SW2 in an off-state is smaller than a second voltage difference between the first voltage level and the value of the second control signal SW2 in an on-state, the clock feedthrough effect is eliminated, the locking period of the VCO is shortened, and the phase noise of the VCO is minimized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for controlling a switched capacitor circuit having a capacitor coupled to a first positive side node, the method comprising the following steps:
    disconnecting the first positive side node from a second node to switch off the switched capacitor circuit according to a first control signal;
    precharging the first positive side node to a precharge voltage for a predetermined time when the switched capacitor circuit is switched off according to the first control signal; and then
    charging the first positive side node to a charge voltage until the switched capacitor circuit is switched on according to the first control signal.

2. The method of claim 1, wherein the precharging and charging steps further comprise:
    coupling the first positive side node to a third node according to a second control signal;
    coupling the third node to a fourth node according to the first control signal; and
    generating the second control signal to be at a first voltage level for the predetermined time when the switched capacitor circuit is switched off according to the first control signal, and then to be at a second voltage level for a remaining time while the switched capacitor circuit is switched off; wherein a first voltage difference between values of the first control signal in an on-state and an off-state is greater than a second voltage difference between the first voltage level and the second voltage level.

3. The method of claim 2, wherein the value of the first control signal in the on-state is substantially equal to the first voltage level.

4. The method of claim 2, wherein the switched capacitor circuit further has a negative side capacitor coupled to a first negative side node, the method further comprising the following steps:

disconnecting the first negative side node from the second node when the switched capacitor circuit is switched off according to a first control signal;

precharging the first negative side nodes to the precharge voltage for the predetermined time when the switched capacitor circuit is switched off according to the first control signal; and then charging the first negative side node to the charge voltage until the switched capacitor circuit is switched on according to the first control signal.

5. The method of claim 4, wherein the precharging and charging steps further comprise coupling the first negative side node to the third node according to the second control signal.

6. The method of claim 4, further comprising selectively coupling the first positive side node to the first negative side node according to the first control signal.

7. The method of claim 1, wherein the precharging and charging steps further comprise:

coupling the first positive node to a third node according to the second control signal;

providing a diode coupled between the first positive side node and the third node;

coupling the third node to a fourth node according to the first control signal; and generating the second control signal; wherein the second control signal is the first control signal delayed by the predetermined time;

wherein the second node is coupled to a constant voltage source at a first voltage level, the fourth node is coupled to a constant voltage source at a second voltage level; and a first voltage difference between the second voltage level and the value of the second control signal in an off-state is smaller than a second voltage difference between the first voltage level and the value of the second control signal in an on-state.

8. The method of claim 7, wherein the value of the second control signal in the off-state is substantially equal to the first voltage level.

9. The method of claim 7, wherein the switched capacitor circuit further has a negative side capacitor coupled to a first negative side node, the method further comprising the following steps:

disconnecting the first negative side node from the second node when the switched capacitor circuit is switched off according to a first control signal;

precharging the first negative side nodes to the precharge voltage for the predetermined time when the switched capacitor circuit is switched off according to the first control signal; and then charging the first negative side node to the charge voltage until the switched capacitor circuit is switched on according to the first control signal.

10. The method of claim 9, wherein the precharging and charging steps further comprise:

coupling the first negative side node to the third node according to the second control signal; and providing a negative side diode coupled between the first negative side node and the third node.

11. The method of claim 10, further comprising:

forming the positive side diode using a first transistor having the base and the collector, or the gate and the drain of the first transistor being shorted together; and forming the negative side diode using a second transistor having the base and the collector, or the gate and the drain of the second transistor being shorted together.

12. The method of claim 9, further comprising selectively coupling the first positive side node to the first negative side node according to the first control signal.

13. A method for controlling a switched capacitor circuit used in an oscillator, the switched capacitor circuit having a capacitor coupled to a first positive side node and coupled to an oscillator node of the switched capacitor circuit, and the method comprising the following steps:

disconnecting the first positive side node from a second node to switch off the switched capacitor circuit according to a first control signal;

precharging the first positive side node to a precharge voltage for a predetermined time when the switched capacitor circuit is switched off according to the first control signal; and then charging the first positive side node to a charge voltage until the switched capacitor circuit is switched on according to the first control signal.

* * * * *

UNITED STATES PATENT AND TRADEMARK OFFICE
CERTIFICATE OF CORRECTION

PATENT NO.       : 7,622,980 B2  Page 1 of 1
APPLICATION NO. : 11/469875
DATED            : November 24, 2009
INVENTOR(S)      : En-Hsiang Yeh It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 700 days.

Signed and Sealed this

Fourteenth Day of December, 2010

David J. Kappos
*Director of the United States Patent and Trademark Office*